United States Patent [19]

Ikesugi et al.

[11] Patent Number: 5,688,133
[45] Date of Patent: Nov. 18, 1997

[54] VACUUM PLACEMENT COVER

[75] Inventors: Hiroshi Ikesugi, Yokohama; Shinichirou Maruyama, Ayase, both of Japan

[73] Assignee: Molex Incorporated, Lisle, Ill.

[21] Appl. No.: 567,462

[22] Filed: Dec. 5, 1995

[30] Foreign Application Priority Data

Dec. 7, 1994 [JP] Japan .................................. 6-16186

[51] Int. Cl.$^6$ ................................................ H01R 13/44
[52] U.S. Cl. ............................................ 439/135; 439/940
[58] Field of Search ................................. 439/135, 148, 439/149, 150, 940

[56] References Cited

U.S. PATENT DOCUMENTS

| | | | |
|---|---|---|---|
| 4,396,245 | 8/1983 | Lane | 339/38 |
| 4,795,354 | 1/1989 | Owen | 439/135 |
| 4,871,324 | 10/1989 | Brune et al. | 439/189 |
| 4,969,829 | 11/1990 | Sato | 439/83 |
| 5,024,607 | 6/1991 | Kachlic | 439/567 |
| 5,055,971 | 10/1991 | Fudala et al. | 361/400 |
| 5,249,977 | 10/1993 | Tanaka et al. | 439/940 |
| 5,277,601 | 1/1994 | Miyazawa | 439/940 |

FOREIGN PATENT DOCUMENTS

| | | |
|---|---|---|
| 6-50286 | 7/1994 | Japan . |
| 2271475 | 4/1994 | United Kingdom .................. 439/135 |

*Primary Examiner*—Neil Abrams
*Attorney, Agent, or Firm*—Charles S. Cohen

[57] ABSTRACT

A vacuum placement member for use with the pneumatic transfer of electrical connectors in which the connectors have housings formed from two opposite longitudinal walls includes a flat cover plate and pairs of resilient legs connected to edges of the cover plate to engage the connector body longitudinal walls. The legs include main legs and an auxiliary legs descending downwardly from the cover plate and spaced apart from each other to form an intervening space therebetween for receiving and sandwiching the longitudinal walls of the connector body therebetween. The connector body longitudinal walls are thereby supported against the force applied thereto by the cover member and inward deformation of the connector body longitudinal walls is substantially prevented.

19 Claims, 4 Drawing Sheets

VACUUM PLACEMENT COVER

BACKGROUND OF THE INVENTION

The present invention relates generally to electrical connectors, and more particularly, to a vacuum placement member associated with such connectors which provides a support for vacuum attachment to the connectors and which provides support to the connector walls during the soldering thereof to a circuit board.

BACKGROUND OF THE INVENTION

Vacuum transfer and placement mechanisms are well known in the electronic assembly art and are used for retrieving electronic components, such as connectors, from a supply source and transferring them by applying negative air pressure to the connectors and placing them onto a printed circuit board in a preselected position for soldering. Typically, such apparatus are used with robotic assemblers and includes a transfer arm with an engagement end that is pneumatically connected to a source of negative air pressure. This negative air pressure creates a vacuum at the engagement end of the transfer arm which can be used to effectively "grab" a connector so that the connector may be robotically transferred into a placement position with great accuracy onto a circuit board or like component.

Most electronic connectors are devoid of flat, large, solid portions. Such connectors, for the most part, also have an overall structure which contains openings in the bottom and/or sidewalls of the connector which receive connector contacts. These openings represent porous surfaces on the connector and therefore, the effective use of vacuum transfer mechanisms to transfer and place such connectors are defeated. To overcome this problem, transfer or placement members have been developed in the art for use with connectors which attach to the connector and which provide a flat, non-porous surface to the connector for engagement by vacuum transfer assemblies. These members may also be referred to as connector gripping members because they, in essence, grip the sidewalls of a connector.

Such a connector gripping member is described in Japanese Utility Model Application No. 6-50286 which has been laid open for publication. It is designed for an electric connector whose housing has two opposite sidewalls extending longitudinally. The gripping member includes a ceiling plate having a flat top surface and pairs of resilient legs connected to each end of the ceiling plate which depend downward from the edges of the ceiling plate to engage the outer surfaces of the opposite sidewalls of the electric connector.

Other connector placement covers described in the art include those which are the subject of U.S. Pat. No. 5,249,977, issued Oct. 5, 1993 and of U.S. Pat. No. 5,277,601, issued Jan. 11, 1994, assigned to the assignee of the present invention. The former patent describes a connector placement cover which has a flat surface suitable for gripping by a vacuum transfer arm and engagement legs which depend down from the top surface and engage central walls of the connector. The latter patent describes a placement cover which has a flat top surface and two downwardly extending gripping legs which engage the outer surfaces of the sidewalls of the connector body. The prior art connectors described above engage only one surface of the connector sidewalls.

It is therefore understood that the prior art describes connector placement members which grip the connector along only one side of each sidewall to permit application of negative air pressure to the placement member top flat surface, so that the connector may be transferred by vacuum means to a printed circuit board for mounting thereon. In this singular type of engagement, the connector placement covers exert forces on the connector walls which may lead to misalignment or misengagement problems.

In the assembly process, once the connectors are mounted in position onto the circuit board to form a connector-board assembly, the circuit board passes through a reflow vessel, in which solder applied to selected conductors of the circuit pattern on the printed circuit board is melted to thereby solder the tail portions of the terminals of the electric connector to the printed circuit.

While the circuit board is passed through the reflow vessel, the longitudinal walls of the connectors positioned thereon may be pressed slightly inwardly by the resilient legs of the connector placement member. The longitudinal walls of the connector may deform slightly inwardly with the result being that mating with another connector is prevented.

The soldering process is typically accomplished by passing the circuit boards with its connectors through a heating zone in which infrared lamps are positioned above and along the path of the circuit boards. The vacuum placement members remain in place on the connectors during this soldering process. The heat emitted by these infrared lamps may heat the connector body walls which may result in the softening of their material of construction, typically a plastic. Slight deformations may occur in the connector walls as a result of the griping forces applied thereto by the vacuum placement member. Should such deformations occur, the potential exists for misalignment and misengagement between the connector and its mating counterpart.

The present invention is therefore directed to a connector vacuum placement cover which overcomes the above-described disadvantages and problems.

SUMMARY OF THE INVENTION

It is therefore an object of the present invention to provide a connector placement or gripping member for use with vacuum transfer of electric connectors which alleviates deformation in the connectors while passing through a reflow vessel.

Another object of the present invention is to provide a vacuum placement cover for a connector of the type having a longitudinal slot bounded by two opposing sidewalls in which the cover includes gripping legs disposed on opposite surfaces of the connector sidewalls in order to prevent the application of unbalanced gripping forces to the connector sidewalls.

It is still another object of the present invention to provide an improved cover member for a connector in which the cover member has a flat covering surface which is adapted to be engaged by a vacuum transfer mechanism, and in which the cover member includes means for gripping the connector so as to exert a balanced gripping force on the connector which reduces the likelihood of deformation and warpage occurring in the connector.

It is yet another object of the present invention to provide a connector transfer member for engaging a connector while presenting a flat attachment surface suitable for engagement by a vacuum or other placement mechanism, in which the connector transfer member includes first pairs of gripping legs which engage confronting first surfaces of the connector sidewalls and second pairs of gripping legs which are spaced apart from the first gripping legs and which engage confronting second surfaces of the connector sidewalls, wherein the first and second gripping legs cooperate together to offset any detrimental attachment forces from deforming the connector.

To attain these objects, the present invention includes a gripping, or placement member for an electric connector having a housing with two elongated opposite walls extending generally parallel in a longitudinal direction. The gripping member includes a cover plate having a flat top surface and pairs of resilient engagement legs or arms connected to and descending down from edges of the cover plate in order to contact the connector walls in a manner to sandwich the connector walls between associated pairs of legs. The pairs of engagement legs may be characterized as main and auxiliary legs, in that in one embodiment of the present invention, pairs of main engagement legs descend down near the ends of the cover plate, while like pairs of auxiliary engagement and support legs extend downwardly near the ends of the cover plate so that the auxiliary engagement legs define connector wall support surfaces which lie on opposite sides and interior of the main engagement legs. With this arrangement, each longitudinal wall of the connector is, in effect, sandwiched between the main and auxiliary legs to substantially prevent deformation or warpage of the connector body on walls while passing through the reflow vessel.

These and other objects, features and advantages of the present invention will be clearly understood through a consideration of the following detailed description.

BRIEF DESCRIPTION OF THE DRAWINGS

In the course of the following description of the detailed description, reference will be made to the attached drawings wherein like reference numerals identify like parts and wherein.

DESCRIPTION OF PREFERRED EMBODIMENTS

Figure 5:
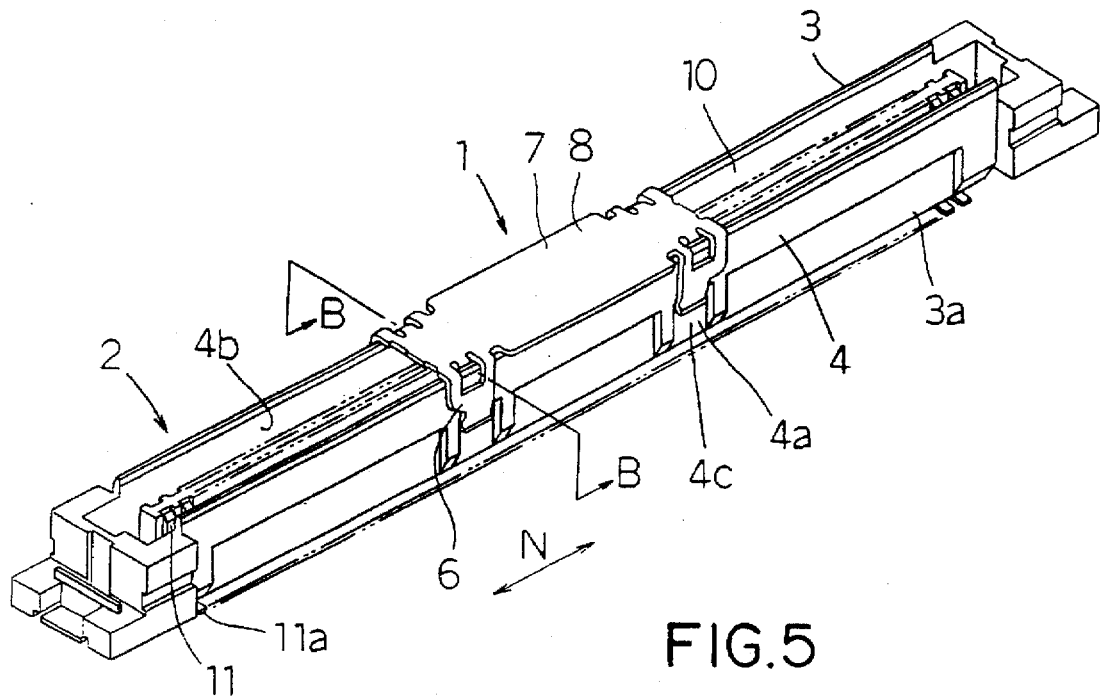
FIG. 5 is a perspective view of an electrical connector having the connector placement member of FIG. 1 attached thereto.
Figure 6:
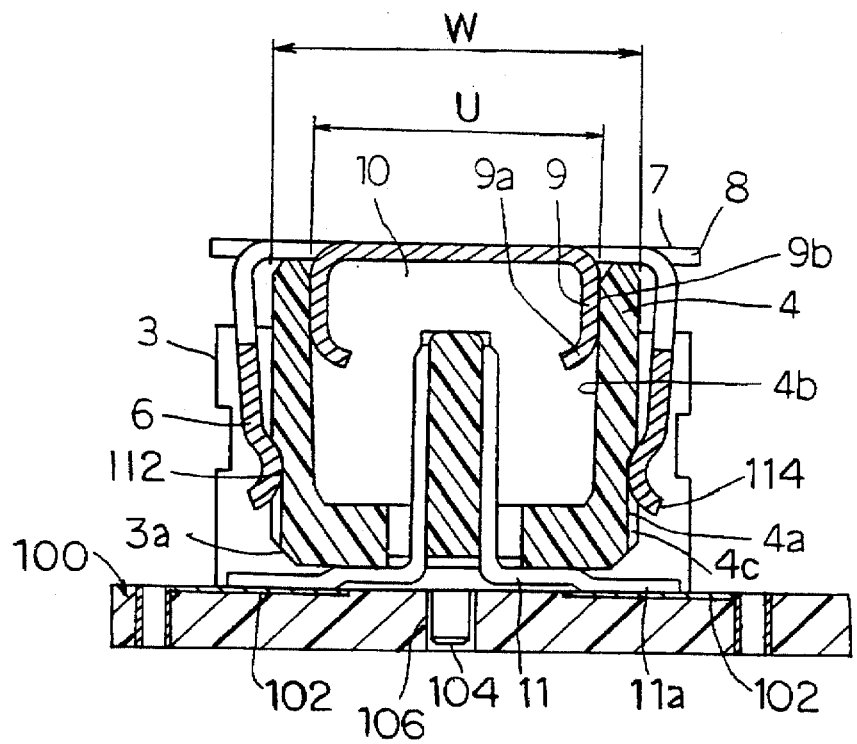
FIG. 6 is a cross-sectional view of the electrical connector assembly of FIG. 5 taken along line B—B thereof.

Referring now to the drawings and in particular FIGS. 5 and 6, an electrical connector 2 is indicated generally at 2 and includes a rectangular housing 3 formed from an insulative material. Within the housing along a longitudinal direction N, a plurality of connector terminals 11 are arranged at regular intervals. The connector housing 3 has a pair of opposing longitudinal sidewalls 4 which define a slot 10 therebetween which is intended to receive a mating electric connector therein.

Figure 1:
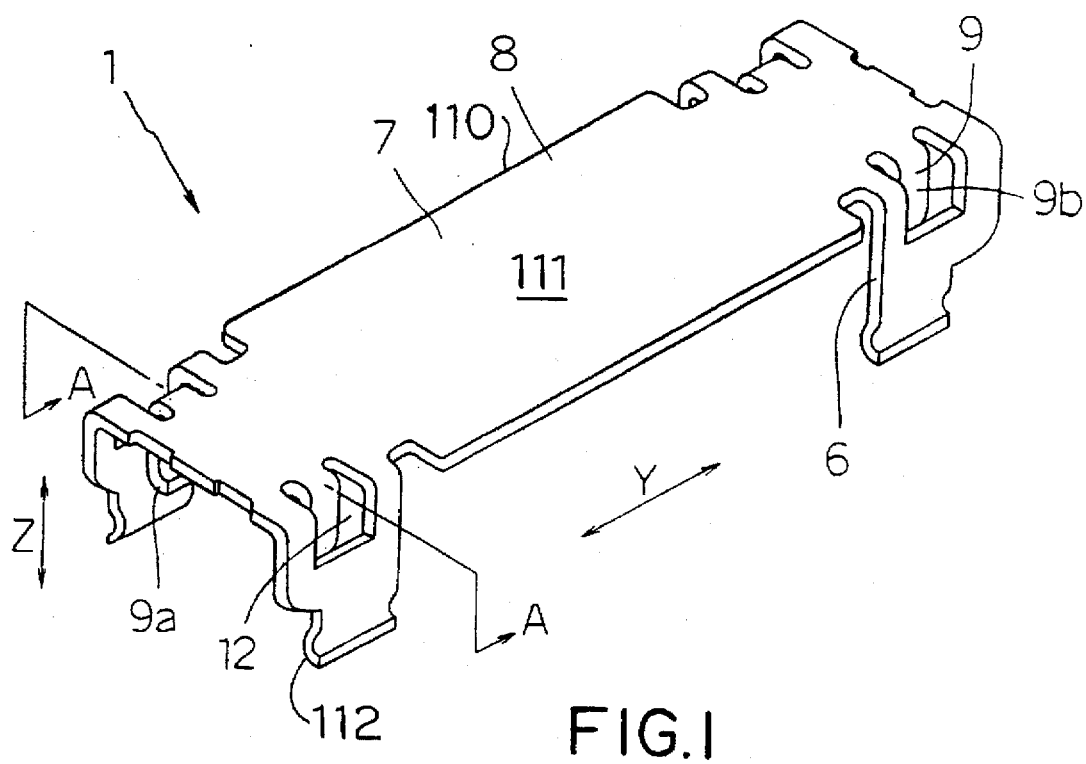
FIG. 1 is a perspective view of a first embodiment of a connector placement member constructed in accordance with the principles of the present invention.

Each connector terminal 11 can be seen in FIG. 6 to possess a solder tail portion 11a which extends out from the bottom edge 3a of the connector housing 3 along the sides of the connector 2. These solder tail portions 141a are used for soldering the connector to a printed circuit board 100 (FIG. 6) by soldering the tail portions 11a to pads or traces 102 of the circuit board 100. Turning to FIG. 1, a connector placement member 1 constructed in accordance with the present invention is illustrated. This connector placement member 1 is used to provide a substantially planar, or flat, surface to the connector 3 when attached thereto. This flat top surface 7 is engaged by a transfer or placement mechanism in which typically has an internal port communicating with a source of negative air pressure. The negative air pressure creates a vacuum at the transfer arm port which results the transfer arm to attach it to the connector placement member by suction, as is known in the art. Once attached, the connector may be transferred from a supply source (not shown) to another electronic assembly component, typically a circuit board 100. The connector placement member 1 remains in place upon the connector until after it is joined to the circuit board.

The connector 2 is placed in position on the circuit board 100 (FIG. 6) so that its solder tail portions 11a lie above and in contact with tracer 102 on the circuit board 100. The proper positioning of the connector 2 in the circuit board 100 is often assisted by mounting pegs 104 which depend down from the connector base 106 and are received within mounting holes 106 in the circuit board 100. Once the connector(s) 2 are mounted on the circuit board 100, a connector-board assembly is formed which is transferred to a heating zone so that the solder previously applied to the circuit traces 102 may be melted in order to form a firm and reliable electrical contact between the connector 2 and the circuit board 100.

Heating units, such as one or more infrared lamps (not shown), are positioned in the heating zone proximity to the connector-board assemblies, typically above or alongside the connector-board assemblies to heat the solder until it melts. Due to the elevation of the connector 2 above the circuit board 2, the sidewalls 4 of the connector 2 are exposed to the heating means. This exposure may often cause softening of the connector sidewalls 4. When connector placement members are used on connectors while they remain in the heating zone, the likelihood exists that the placement covers may institute or otherwise cause some deformation in the sidewalls 4 of the connectors. If such deformation occurs, there may occur mismating of the connectors 2 with their counterpart connectors.

The present invention is directed to a connector placement member which reduces the likelihood of such deformation and which provides a reinforcement to the connector sidewalls 4. Returning to FIG. 1, the connector placement member 1 is seen to include a cover plate 8 and pairs of resilient engagement legs 6. The cover plate 8 preferably has a flat top surface 7 disposed within its outer perimeter 110 which defines an engagement surface to a transfer arm (not shown) which may attach itself to the surface 7 by the application of negative pressure thereto by a robotic transfer apparatus. When the connector placement member 1 is attached to the electric connector 2, its cover plate 8 and top surface 7 lie atop the insertion slot 10 of the electric connector 2 and, in the embodiment illustrated, over the slot between the two opposing connector sidewalls 4. The perimeter of the connector placement cover 1 extends to the sidewalls 4 and may further extend slightly past the sidewalls.

Figure 2:
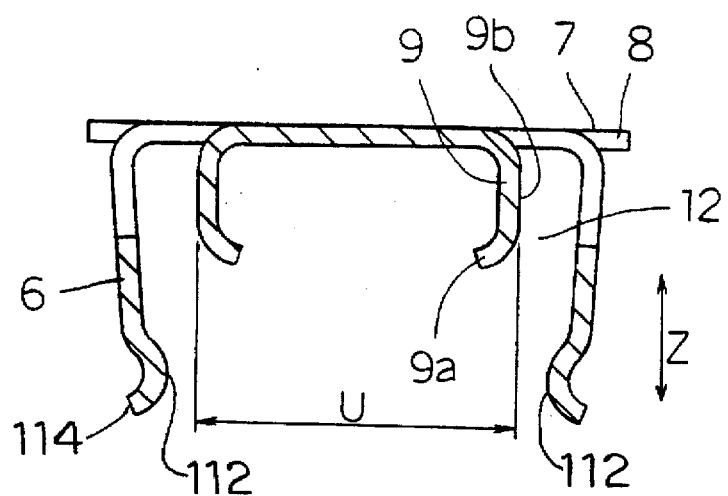
FIG. 2 is a cross section of the connector placement member of FIG. 1 taken along line A—A thereof FIG. 1.
Figure 3:
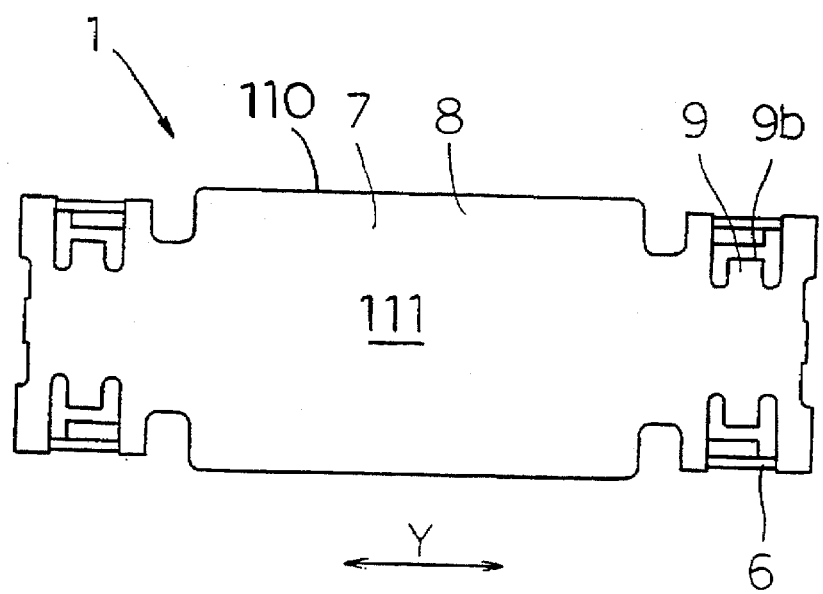
FIG. 3 is a plan view of the connector placement member of FIG. 1.
Figure 4:
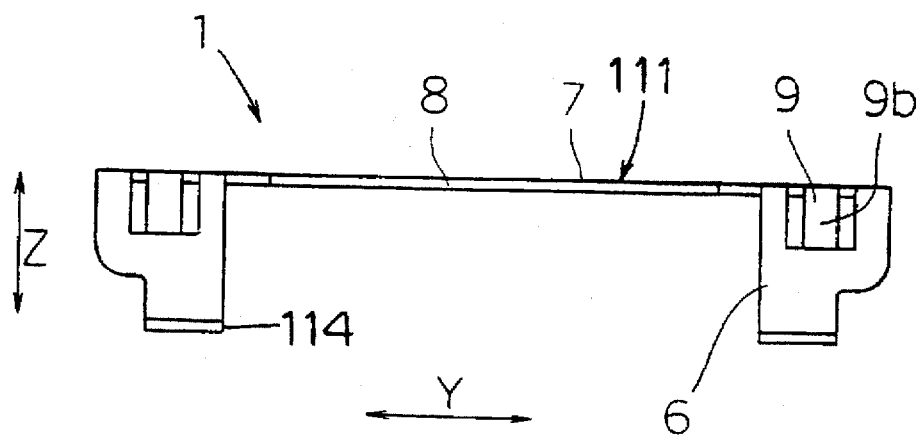
FIG. 4 is an elevational view of the connector placement member of FIG. 1.

The engagement legs 6 are joined to the ends of the cover plate 8 at the corners thereof as illustrated, although the placement of these engagement legs 6 may occur in other locations while still obtaining the benefits and advantages of the invention. The legs 6 depend from the cover plate 8 to form a general U-shaped structure when seen from the end. (FIG. 2.) The engagement legs 6 may be considered as comprising two distinct sets of legs which engage the connector 2. One set, a first set of first engagement legs 6, may include gripping portions 112 at their lower ends 114 which may further extend slightly inwardly. Each connector sidewall 4 has recesses 4c disposed in its outer surface 4a which receive the gripping portions 112 of the engagement legs 6.

The main engagement legs 6 may be formed along with the cover plate 8 together such as by stamping extension portions 116 of a metal blank 111 in the vertical direction Z so that each main engagement leg 6 is aligned in a confronting relationship with an outer surface 4a of the connector sidewalls 4 when the lower plate 8 is applied to a connector 2.

Preferably, the main engagement legs 6 are formed near the corners of the cover plate 8 as illustrated with a spacing between opposing aligned legs which is slightly less than the width W of the connector housing 2 so as to create a slight inward bias to resiliently engage the connector sidewalls 4 in a manner in which the sidewalls 4 are sandwiched therebetween.

In order to resist any deformation which may be induced in the connector sidewalls 4 by virtue of the inwardly directed forces exerted thereupon by the main engagement legs 6, the present invention includes a second set of auxiliary engagement legs 9 which depend downwardly from the cover plate 8 and primarily provide support for the connector sidewalls 4. Each of the auxiliary support legs 9 is preferably aligned with and spaced part from a corresponding main engagement leg 6 so as to create an intervening space 12 therebetween which is generally aligned with the longitudinal axes of each connector sidewall 4. These spaces, 12 as seen in FIG. 6, receive and support the connector sidewalls 4 therein from the interior along their inner surfaces 4b as explained in greater detail to follow.

The auxiliary support legs 9 preferably extend downwardly from the cover plate 8 as do their associated main engagement legs 6 and interior of the main engagement legs 6 when viewing the cover plate 8 from its end, to form an intervening insertion space 12 which receives a sidewall 4 of the connector 2.

Figure 7:
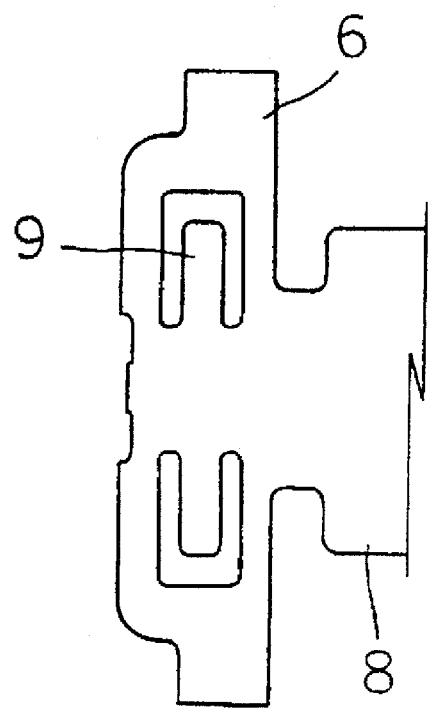
FIG. 7 is an enlarged end view of a metal blank used for forming into a connector placement member as shown in FIG. 1.

The auxiliary legs 9 may be formed in a number of manners. It may be formed by bending a selected extension 9 which is segregated from and punched out of the main engagement leg 6. (FIG. 7.) When formed, it is preferable that the lateral distance between the outer surfaces 9b of the opposite auxiliary legs 9 is equal to the lateral distance U between the inner surfaces 4b of the connector sidewalls 4. In order to facilitate the insertion of the connector sidewalls 4 into the intervening space 12, each auxiliary leg 9 may be equipped with an inwardly-bent end 9a which reduces the likelihood of snagging the placement cover auxiliary support legs 9 on the inner surfaces 4b of the connector sidewalls 4.

The connector placement cover 1 may be formed by punching a piece of metal sheet blank 111 as seen in FIG. 7, by bending the main and auxiliary leg extensions 6 and 9 with respect to the cover plate 8 of the blank 111, thus providing integral main and auxiliary engagement leg connections to the cover plate 8. Other materials of construction, such as plastics, may be used for forming the placement cover 1.

In use, the placement cover 1 is attached to an electric connector 2 by pushing it against the top of the electric connector 2 until the main engagement legs 6 ride down the connector sidewall outer surface 4a until their gripping portions 112 effectively catch in the sidewall recesses 4c. Simultaneously, the auxiliary engagement legs 9 ride down along the connector sidewall surface 4b until the sidewall 4 is effectively sandwiched therebetween. The cover plate 8 thereupon lies upon the connector insertion slot 10 of the connector 2. Inasmuch as the auxiliary support legs 9 extend along the interior 4b of the connector sidewalls 4, each such sidewall 4 is thereby supported by the engagement legs 9 against the forces applied by the main engagement legs 6 of the collector placement cover 1.

When carrying the electric connector 2 to a printed circuit board, the placement member 1 is picked up applying a negative pressure to the flat top surface 7 of the placement cover 1, and then the placement cover-connector assembly is transferred to the printed circuit board 100. Then, the connector-board assembly are passed through a reflow vessel, in which solder applied to selected portions 102 of the circuit board 100 is melted to solder the solder tail portions 11a of the connector terminals 11 to the circuit board 100.

While passing through the reflow vessel, the longitudinal walls 4 of the electric connector 2 are supported against the force applied thereto by the resilient legs 6 of the collector gripper 1, thereby preventing any substantial and detrimental inward deformation of the longitudinal walls 4, which might otherwise occur while in the reflow vessel and which would prevent the mating of the electric connector 2 with its mating counter connector.

It will be appreciated that the embodiments of the present invention discussed herein are merely illustrative of a few applications of the principles of the invention. Numerous modifications may be made by those skilled in the art without departing from the true spirit and scope of the invention.

We claim:

1. An improved electrical connector assembly for mounting to a surface of an electrical apparatus by way of engagement with a pneumatic transfer means, wherein the pneumatic transfer means has an engagement arm which receives a source of negative air pressure so as to effect a vacuum at the engagement arm, the assembly including an elongated connector body having a mounting base for mounting on the electrical apparatus surface, the connector body including a longitudinal axis and two opposing sidewalls generally parallel to said axis which cooperate to define a slot in said connector body, the sidewalls extending up from said mounting base, and a plurality of electrical terminals having tail portions extending out from said connector body, the improvement comprising:

a pneumatic placement cover positioned on said connector body so as to overlie a portion of said connector slot, said placement cover having a substantially planar, smooth top portion disposed within a perimeter of said cover, the top portion defining an engagement surface for said pneumatic transfer means, said placement cover having two, generally parallel longitudinal edges that are positioned generally parallel to the longitudinal axis of said connector body and four pairs of engagement legs depending downwardly from said placement cover generally adjacent said edges of said cover and into engagement with inner and outer surfaces of said connector body sidewalls, each pair including an outer engagement leg and an inner engagement leg, the outer and inner legs being spaced apart from each other to define a connector body sidewall-receiving space therebetween, said spaces receiving body portions of said opposing sidewalls of said connector body, two of said pairs of engagement arms being positioned along each of said longitudinal edges and each of pair being spaced apart from others of said pairs.

2. The electrical connector assembly as defined in claim 1, wherein said placement cover is stamped and formed from a metal blank and wherein said inner legs are stamped and formed from a portion of said outer legs.

3. The electrical connector assembly as defined in claim 1, wherein each of said engagement legs includes a connector body sidewall engagement surface angularly disposed from a plane in which said placement cover top portion lies.

4. The electrical connector assembly as defined in claim 2, wherein said inner and outer legs depend downwardly from said placement cover top portion.

5. The electrical connector assembly as defined in claim 1, wherein said placement cover planar top portion extends over top surfaces of said connector body opposing sidewalls.

6. The electrical connector assembly as defined in claim 1, wherein said outer engagement legs each have a body portion which is joined with said placement cover planar top portion and said inner engagement legs are formed from said main leg body portions.

7. The electrical connector assembly as defined in claim 1, wherein said outer engagement legs are aligned with said connector body sidewall outer surfaces and said inner engagement legs are aligned with said connector body sidewall inner surfaces.

8. The electrical connector assembly as defined in claim 7, wherein said said outer and inner engagement legs respectively engage said connector sidewall outer and inner surfaces at respective different elevations.

9. The electrical connector assembly as defined in claim 1, wherein said four pairs of engagement legs are disposed generally proximate to corners of said placement cover.

10. A connector transfer cover used in facilitating transfer of an electrical connector from a connector supply to a mounting position on an electronic component, wherein the connector has a body portion partially defined by at least two longitudinal sidewalls extending along the connector body portion on opposite sides of a longitudinal axis thereof, and wherein said connector body portion further includes a slot portion disposed between the two connector sidewalls such that each of said two connector sidewalls has opposing inner and outer surfaces, the connector transfer cover comprising: a stamped and formed metal cover portion having a generally flat top surface disposed thereon providing a point of engagement for a pneumatic transfer means, the cover portion having two generally parallel longitudinal edges for positioning generally parallel to the longitudinal axis of said connector body and at least two first engagement arms extending downwardly from said cover portion generally along each said edge and adapted to be positioned in general alignment with said connector sidewall outer surfaces, said at least two first engagement arms being spaced apart along said edge, and at least one second engagement arm positioned generally adjacent each first engagement arm and extending downwardly from said cover portion and adapted to be positioned in general alignment with said connector sidewall inner surfaces, said first and second engagement arms being aligned together in cooperating pairs such that they cooperate to define spaces therebetween which receive a portion of said connector sidewalls when said transfer cover is positioned onto said connector.

11. The connector transfer cover as defined in claim 10, wherein said two longitudinal edges of said cover are adapted to be positioned generally parallel to said connector sidewalls and said cover further includes two transverse edges which are adapted to be positioned generally transverse to said connector sidewalls, said first and second engagement arms being disposed on said connector transfer cover, proximate to such cover portion longitudinal edges.

12. The connector transfer cover as defined in claim 10, wherein said first engagement arms are biased to exert an inwardly-directed engagement force upon said connector sidewalls when said transfer cover is installed on said connector, and said second engagement arms being aligned with said first engagement arms in order to resist at least a portion of said first engagement arm engagement force.

13. The connector transfer cover as defined in claim 10 wherein said second engagement arms have sidewall engagement surfaces which abut said connector sidewall inner surfaces when said transfer cover is installed upon said connector, said second engagement arms providing a reinforcing interior support for said connector sidewalls.

14. An improved electrical connector assembly for mounting to a surface of an electrical apparatus by way of engagement with a pneumatic transfer means, wherein the pneumatic transfer means has an engagement arm which receives a source of negative air pressure so as to effect a vacuum at the engagement arm, the assembly including a connector body having a mounting base for mounting on the electrical apparatus surface, the connector body including at least two opposing sidewalls which cooperate to define a slot in said connector body, the sidewalls extending up from said mounting base, and a plurality of electrical terminals having tail portions extending out from said connector body, the improvement comprising:

a pneumatic placement cover positioned on said connector body so as to overlie a portion of said connector slot, said placement cover being a stamped and formed metal member and having a substantially planar, smooth top portion disposed within a perimeter of said cover, the top portion defining an engagement surface for said pneumatic transfer means, said placement cover having two pairs of engagement legs depending downwardly from said placement cover into engagement with inner and outer surfaces of said connector body sidewalls, each said pair having an inner engagement leg contacting said inner surface of said connector body sidewall and an outer engagement leg contacting said outer surface of said connector body sidewall, each said inner leg being formed from a portion of one of said outer legs.

15. The electrical connector assembly as defined in claim 14, wherein said placement cover includes four pairs of engagement legs, each pair including an outer engagement leg and an inner engagement leg, the outer and inner legs being spaced apart from each other to define a connector body sidewall-receiving space therebetween, said spaces receiving portions of said opposing sidewalls of said connector body therein.

16. The electrical connector assembly as defined in claim 14, wherein each of said engagement legs includes a connector body sidewall engagement surface angularly disposed from a plane in which said placement cover top portion lies.

17. The electrical connector assembly as defined in claim 14, wherein said inner and outer legs depend downwardly from said placement cover top portion.

18. The electrical connector assembly as defined in claim 14, wherein said outer and inner engagement legs respectively engage said connector sidewall outer and inner surfaces at respective different elevations.

19. The electrical connector assembly as defined in claim 15, wherein said four pairs of engagement legs are disposed generally proximate to corners of said placement cover.

* * * * *